United States Patent
Meng et al.

(10) Patent No.: US 8,213,890 B2
(45) Date of Patent: Jul. 3, 2012

(54) SYSTEM AND METHOD FOR TUNING-CAPACITOR-ARRAY SHARING

(75) Inventors: Hao Meng, Beijing (CN); Peiqi Xuan, Saratoga, CA (US)

(73) Assignee: Quintic Holdings, Santa Clara, CA (US)

( * ) Notice: Subject to any disclaimer, the term of this patent is extended or adjusted under 35 U.S.C. 154(b) by 135 days.

(21) Appl. No.: 12/822,182

(22) Filed: Jun. 24, 2010

(65) Prior Publication Data
US 2011/0316654 A1    Dec. 29, 2011

(51) Int. Cl.
*H04B 1/18* (2006.01)
(52) U.S. Cl. ........ 455/191.1; 455/575.3; 455/167.1; 455/180.4; 455/187.1; 333/17.2; 333/17.3
(58) Field of Classification Search .......... 455/191, 455/575.3, 167.1, 180.4, 187.1, 191.1; 333/17.2, 333/17.3
See application file for complete search history.

(56) References Cited

U.S. PATENT DOCUMENTS

| 4,042,970 A | 8/1977 | Atkins |
| 7,079,196 B2 * | 7/2006 | Suzuki ............... 348/731 |
| 2009/0309417 A1 * | 12/2009 | Walley .............. 307/33 |

* cited by examiner

*Primary Examiner* — Sanh Phu
(74) *Attorney, Agent, or Firm* — Blairtech Solution LLC

(57) ABSTRACT

A system and method for sharing a switched capacitor array (SCA) by two tuning circuits are disclosed. In a multiple-band radio receiver, there is a need to use multiple tuning circuits for signals in different bands. The tuning circuit typically comprised an adjustable capacitance device and other tuning components, where the adjustable capacitance device is often implemented in SCA. The present invention discloses a system and method comprising n sections of capacitor elements where each capacitor element comprises a capacitor and switches to selectively connect the capacitor to one of the tuning circuit. Consequently, the SCA can be shared by the two tuning circuits. The control bits for the switched may be provided from a programmable control register.

17 Claims, 8 Drawing Sheets

SYSTEM AND METHOD FOR TUNING-CAPACITOR-ARRAY SHARING

FIELD OF THE INVENTION

The present invention relates to radio frequency system. In particular, the present invention relates to tuning circuits for multiple-band system to share a programmable switched capacitor array.

BACKGROUND

In a radio receiver, a radio frequency (RF) signal is typically received using an antenna and the received RF is then processed along the receive path to recover the original signal transmitted. In the receive path, the received signal is subject to various processing such as amplifying, filtering, down-converting, demodulating, and etc. In a real radio environment, there are many un-intended signals which may interfere with an intended signal if the un-intended signals are not properly processed. By using a tuning filter is one effective means to block un-intended signals to ensure the quality of final received signal. In a radio transmitter, it also provides some advantage to use a tuning filter to suppress out-of-band signals which may be generated un-intentionally through the transmit path. Consequently, a tuning filter is widely used in radio receivers and also used in radio transmitters.

There are cases that a receiver has to receive signals in various frequency bands. For example, for a terrestrial broadcast TV receiver, the tuning circuit has to support TV channels in the low VHF band (such as 44-92 MHz in the US), the high VHF band (such as 167-230 MHz in the US) and the UHF band (for example, 470-860 MHz in the US). In practice, the tunable range of a tuning circuit is less than 20% of the carrier frequency so that the design requirements will not be too stringent. When the tunable range is beyond 20% of the carrier frequency, it will make the design more challenging. One common way to circumvent the issue of designing a tuning circuit with a very wide tuning-range is to use multiple tuning circuits so that the tuning range for each tuning filter can be effectively reduced.

A tuning circuit often comprises an adjustable capacitance device and other components such as inductors and resistors. A common practice in the field of integrated circuit is to use a switched capacitor array (SCA) as the adjustable capacitance device. The SCA usually comprises an array of capacitors connected in parallel where each capacitor is controlled by a respective switch to connect or disconnect the capacitor to or from the array. Therefore, the capacitance of the SCA can be digitally controlled by applying control signals to the switches. The SCA usually will take up a sizable silicon area. Multiple tuning circuits imply multiple SCAs needed. Therefore, it is very desirable to provide a system and method for multiple tuning circuits to share the SCA.

BRIEF SUMMARY OF THE INVENTION

According to one embodiment of the present invention, a device to provide two tuning circuits to share an adjustable capacitance device is disclosed. The device comprises at least one first tuning component coupled to a first node, at least one second tuning component coupled to a second node, and at least one variable capacitance device configured to selectively couple to one of the first node and the second node according to mode control. The said at least one first tuning component and said at least one variable capacitance device form a first tuning circuit when the mode control causes said at least one variable capacitance device to couple to the first node, and said at least one second tuning component and said at least one variable capacitance device form a second tuning circuit when the mode control causes said at least one variable capacitance device to couple to the second node. Furthermore, said at least one variable capacitance device comprises a digitally programmable switched capacitor array configured to adjust tuning frequency of one of the first tuning circuit and the second tuning circuit according to the mode control. The tuning frequency is adjusted in response to a plurality of first tuning control signals for the first tuning circuit and in response to a plurality of second tuning control signals for the second tuning circuit, and the plurality of first tuning control signals and the plurality of second tuning control signals are generated by a digitally programmable control register.

In another embodiment of the present invention, said digitally programmable switched capacitor array comprises a plurality of capacitor sections coupled in parallel. Furthermore, each of the plurality of capacitor sections comprises a fixed capacitor, said digitally programmable switched capacitor array further comprises a plurality of first transistors and a plurality of second transistors, each of the plurality of first transistors being coupled in series with the first node and the fixed capacitor in a respective one of the plurality of capacitor sections, each of the plurality of second transistors being coupled in series with the second node and the fixed capacitor in a respective one of the plurality of capacitor sections, and wherein each of the plurality of first tuning control signals controls a respective transistor in the plurality of first transistors and each of the plurality of second tuning control signals controls a respective transistor in the plurality of second transistors. In yet another embodiment of the present invention, the plurality of first tuning control signals and the plurality of second tuning control signals comprise multiple bits of a digital signal. Said at least one first tuning component and said at least one second tuning component may comprise an inductor or an resistor.

In still another embodiment of the present invention, an integrated circuit for radio frequency receiver is disclosed. The integrated circuit for radio frequency receiver comprises a low-noise amplifier (LNA) coupled to receive a radio frequency signal using two tuning circuits, at least one first tuning component coupled to a first node, at least one second tuning component coupled to a second node, and at least one variable capacitance device configured to selectively couple to one of the first node and the second node according to mode control. Said at least one first tuning component and said at least one variable capacitance device form a first tuning circuit when the mode control caused said at least one variable capacitance device to couple to the first node. Said at least one second tuning component and said at least one variable capacitance device form a second tuning circuit when the mode control caused said at least one variable capacitance device to couple to the second node.

In another embodiment of the present invention, a method of sharing an adjustable capacitance device by two tuning circuits is disclosed. The method comprises providing at least one first tuning component coupled to a first node, providing at least one second tuning component coupled to a second node, providing at least one variable capacitance device, and coupling said at least one variable capacitance device selectively to one of the first node and the second node to form respectively one of a first tuning circuit and a second tuning circuit according to mode control. Said at least one variable capacitance device comprises a digitally programmable switched capacitor array configured to adjust tuning frequency of one of the first tuning circuit and the second tuning circuit according to the mode control. When said at least one variable capacitance device is coupled to the first node according to the mode control, the method further comprises applying a plurality of first tuning control signals to the first tuning circuit to adjust the tuning frequency of the first tuning circuit. When said at least one variable capacitance device is coupled to the second node according to the mode control, the method further comprises applying a plurality of second tuning control signals to the first tuning circuit to adjust the tuning frequency of the second tuning circuit.

DETAILED DESCRIPTION OF THE INVENTION

In a radio receiver, a tuning circuit is often used in various stages of the receive path to allow the passage of intended signals while attenuate the undesired signals. For example, a tuning circuit may be used in the RF stage along with a low-noise amplifier (LNA) so that only the intended signal will be passed and amplified. A properly designed tuning circuit will effectively reject out of band signals that may potentially result in image signals of an intended signal. Depending on the intended application, the tuning circuit has to support a range of tunable frequencies. For example, a terrestrial broadcast TV receiver, the tuning circuit has to support TV channels in the low VHF band (such as 44-92 MHz in the US), the high VHF band (such as 167-230 MHz in the US) and the UHF band (such as 470-860 MHz in the US). In general, a wider tunable-range circuit is harder to design than a narrower tunable-range circuit. In practice, the tunable range is maintained to be less than 50% of the carrier frequency as a general design rule. When the tunable range is beyond 50% of the carrier frequency, it makes the design more challenging.

In the above example, there are three distinct bands that a TV receiver needs to support. If a single tuning circuit is used to tune all bands, the tuning range is almost as large as the highest carrier frequency, which makes the design extremely difficult. Consequently, multiple tuning circuits have been widely used to receive multiple TV bands. The tuning circuit typically comprises a mix of inductors, capacitors and resistors, where one or more of these components have adjustable values to tuning the center frequency of the tuning filter. In recently years, the switched capacitor array (SCA) with multiple capacitors connected in parallel has been widely used as a variable capacitance device, where the capacitors are selectively connected to result in a desired capacitance value.

Figure 1A:
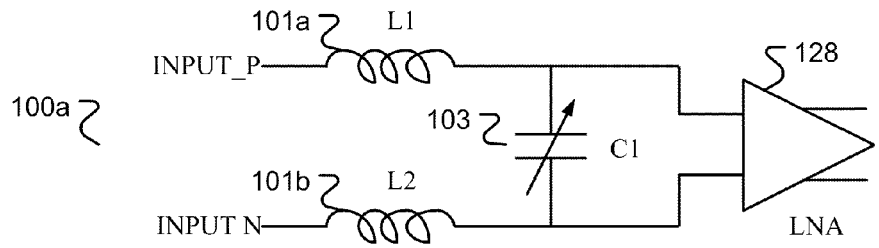
FIG. 1A illustrates conventional differential tuning circuit having an adjustable capacitance device for a single-band radio receiver.

FIG. 1A illustrates simplified single tuning circuit 100a to receive a differential radio frequency signal. The tuning circuit comprises two inductors L1 101a and L2 101b and an adjustable capacitor C1 103. A differential amplifier 128 is used to amplify the tuned input signal.

Figure 1B:
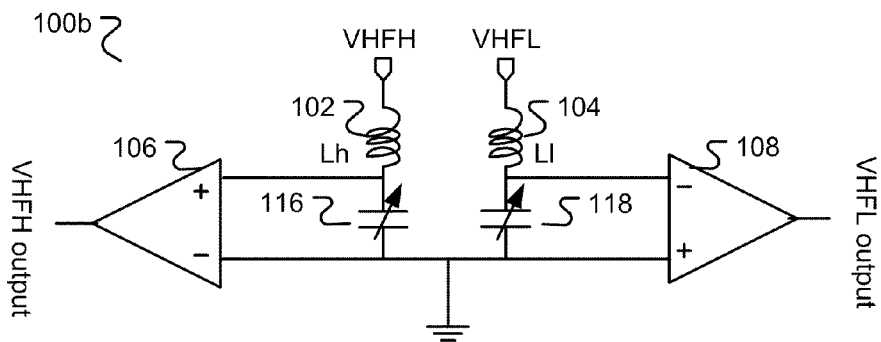
FIG. 1B illustrates conventional single-ended tuning circuits having separate adjustable capacitance devices for a multiple-band radio receiver.
Figure 1C:
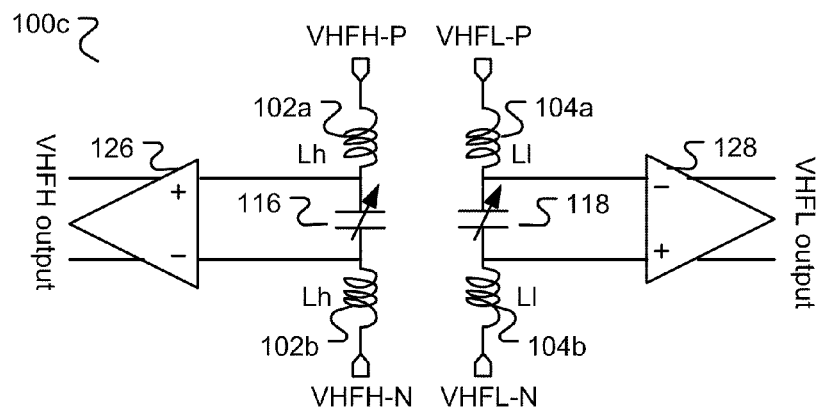
FIG. 1C illustrates conventional differential tuning circuits having separate adjustable capacitance devices for a multiple-band radio receiver.

FIG. 1B illustrates simplified multiple tuning circuits to receive multiple-band signals. The circuit 100b in FIG. 1B illustrates a single-ended system where the two tuning circuits comprise respective inductors Lh 102 and L1 104, and adjustable capacitors 116 and 118. The signals across the adjustable capacitors are amplified by respective low-noise amplifiers (LNAs) 106 and 108. The circuit on the left half of circuit 100b represents one for high VHF TV band and the right half of circuit 100b represents one for low VHF TV band. The signals labeled as VHFH and VHFL represent the input signals corresponding to VHF high band and VHF low band respectively. The two signals may be coupled to a same VHF antenna. Two tuning circuits are used as an example to illustrate the arrangement of separate adjustable capacitance devices being used in a conventional approach. Additional tuning circuit may be used to support more bands. For example, an additional tuning circuit may be used for UHF TV band. FIG. 1C illustrates simplified multiple tuning circuits 100c to receive multiple-band signals, where the input and output signals are differential signals. A pair of inductors, Lh 102a and L1 102b is used to couple the input differential signals VHFH-P and VHFH-N to the adjustable capacitor device 116 for the high VHF band. Similarly, a pair of inductors, 104a and 104b is used to couple the input differential signals VHFL-P and VHFL-N to the adjustable capacitor device 118 for the low VHF band. Differential LNAs 126 and 128 are used to amplify the differential input signals. In FIGS. 1B and 1C, a large inductance value is associated with the low VHF band in order to accommodate the lower tuning frequency intended. The inductor is more difficult to implement in an integrated circuit based on CMOS technology. Therefore, the inductor usually is implemented as an external component instead of integrated on-chip. The lower tuning frequency can also be achieved by using a larger capacitance value. However, the silicon area required to implement a capacitor is substantially proportional to the capacitance value. Therefore, to implement a capacitor with four times the capacitance will result in a silicon area four times as large. It is more advantageous to use a larger external inductor value instead of increasing the capacitance value of the on-chip adjustable capacitance device. For the CMOS technology, the capacitance is about 1 fF/$\mu m^2$ and a 50 pF capacitor will take up a silicon area around 0.05-0.1 $mm^2$.

Figure 2A:
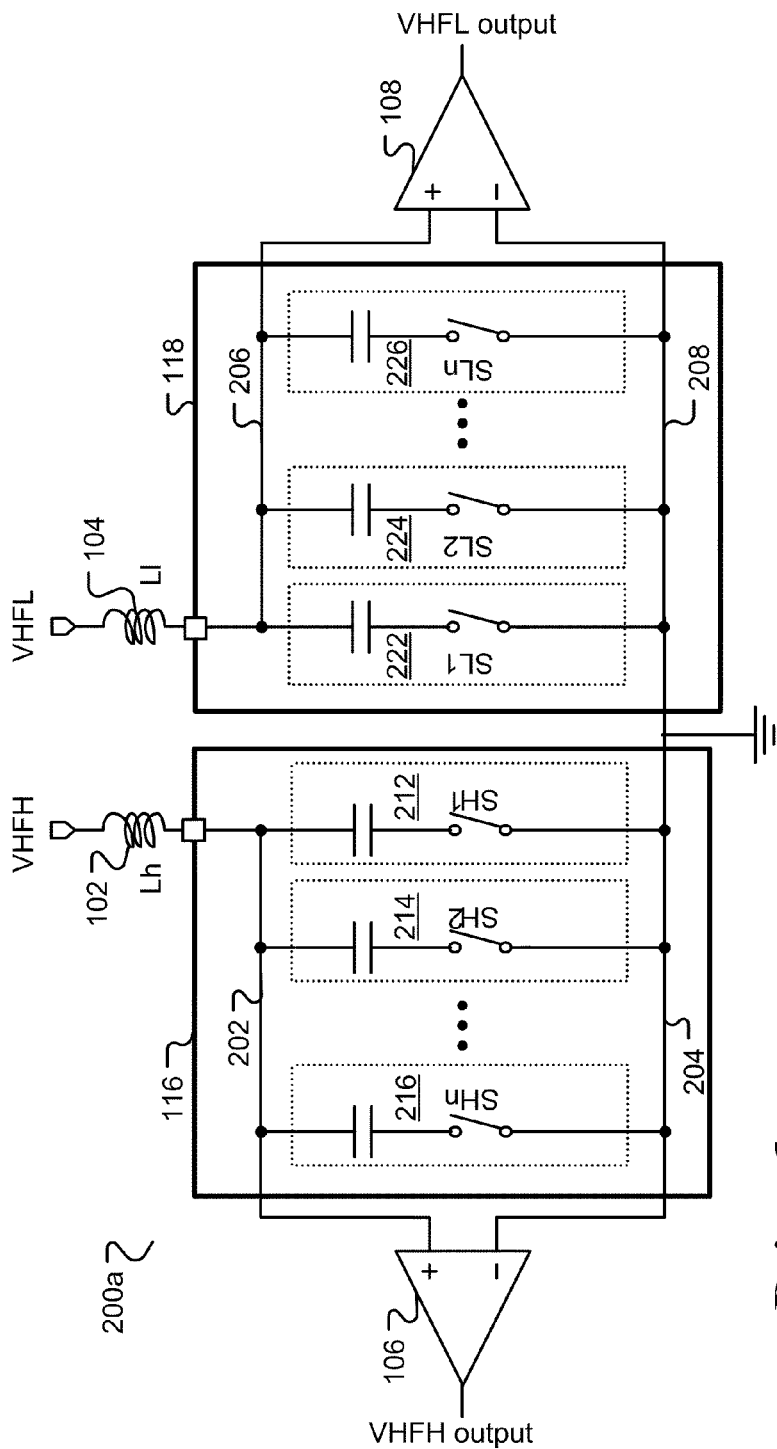
FIG. 2A illustrates two separate programmable switched capacitor arrays being used for conventional single-ended tuning circuits for a multiple-band radio receiver.

FIG. 2A illustrates an exemplary implementation of the multiple tuning circuits 200a of FIG. 1B using a switched capacitor array (SCA). Each of the adjustable capacitors 116 and 118 is implemented by an array of n capacitors connected in parallel where each capacitor is serially connected to a respective switch to selectively connect the capacitor according to a control signal applied to the switch. Each of the capacitor sections 212, 214 and 216 for the high VHF band is connected between the node 202 coupled to the external inductor 102 and the ground node 204. Each of the capacitor sectors has a respective switch (SH1 through SHn) to control whether the respective capacitor is connected between the node 202 and the node 204. Similarly, each of the capacitor sections 222, 224 and 226 for the low VHF band is connected between the node 206 coupled to the external inductor 104 and the ground node 208. Each of the capacitor sectors has a respective switch (SL1 through SLn) to control whether the respective capacitor is connected between the node 206 and the node 208. A binary weighted SCA is often used to implement the adjustable capacitance device where the capacitance values for the SCA are $C \cdot 2^0, C \cdot 2^1, \ldots, C \cdot 2^{n-1}$, and C is a constant. Nevertheless, the binary weighted SCA is described here as an example and the present invention is not limited to the weighted SCA. For CMOS-based integrated circuit, MOS capacitor can be used to form the elements for the SCA and MOS capacitor is well known to a person skilled in the art for implementing a capacitor. The present invention is not limited to the MOS capacitor implementation and can be applicable to capacitor implement based on other technologies.

Figure 2B:
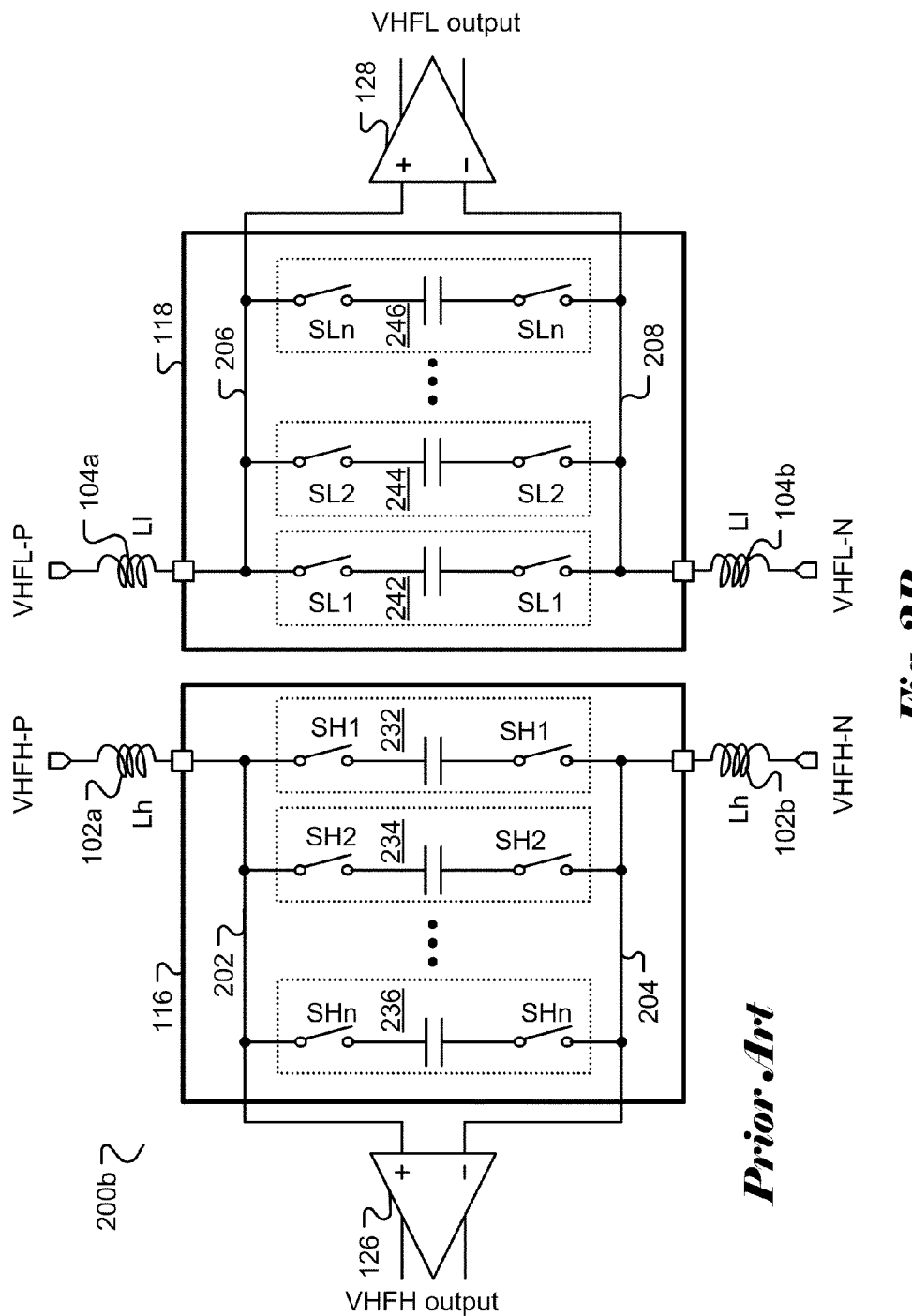
FIG. 2B illustrates two separate programmable switched capacitor arrays being used for conventional differential tuning circuits for a multiple-band radio receiver.

FIG. 2B illustrates an exemplary implementation of multiple tuning circuits 200b of FIG. 1C using a switched capacitor array (SCA). Each of the adjustable capacitors 116 and 118 is implemented by an array of n capacitors connected in parallel where each capacitor is serially connected to two respective switches to selectively connect the capacitor according to a control signal applied to the switches. Each of the capacitor sections 232, 234 and 236 for the high VHF band is connected between the node 202 coupled to the external inductor 102a and the node 204 coupled to the external inductor 102b. Each of the capacitor sectors has a pair of respective switches (SH1 through SHn) to control whether the respective capacitor is connected between the node 202 and the node 204. Similarly, each of the capacitor sections 242, 244 and 246 for the low VHF band is connected between the node 206 coupled to the external inductor 104a and the node 208 coupled to the external inductor 104b. Each of the capacitor sections has a pair of respective switches (SL1 through SLn) to control whether the respective capacitor is connected between the node 206 and the node 208.

Figure 3A:
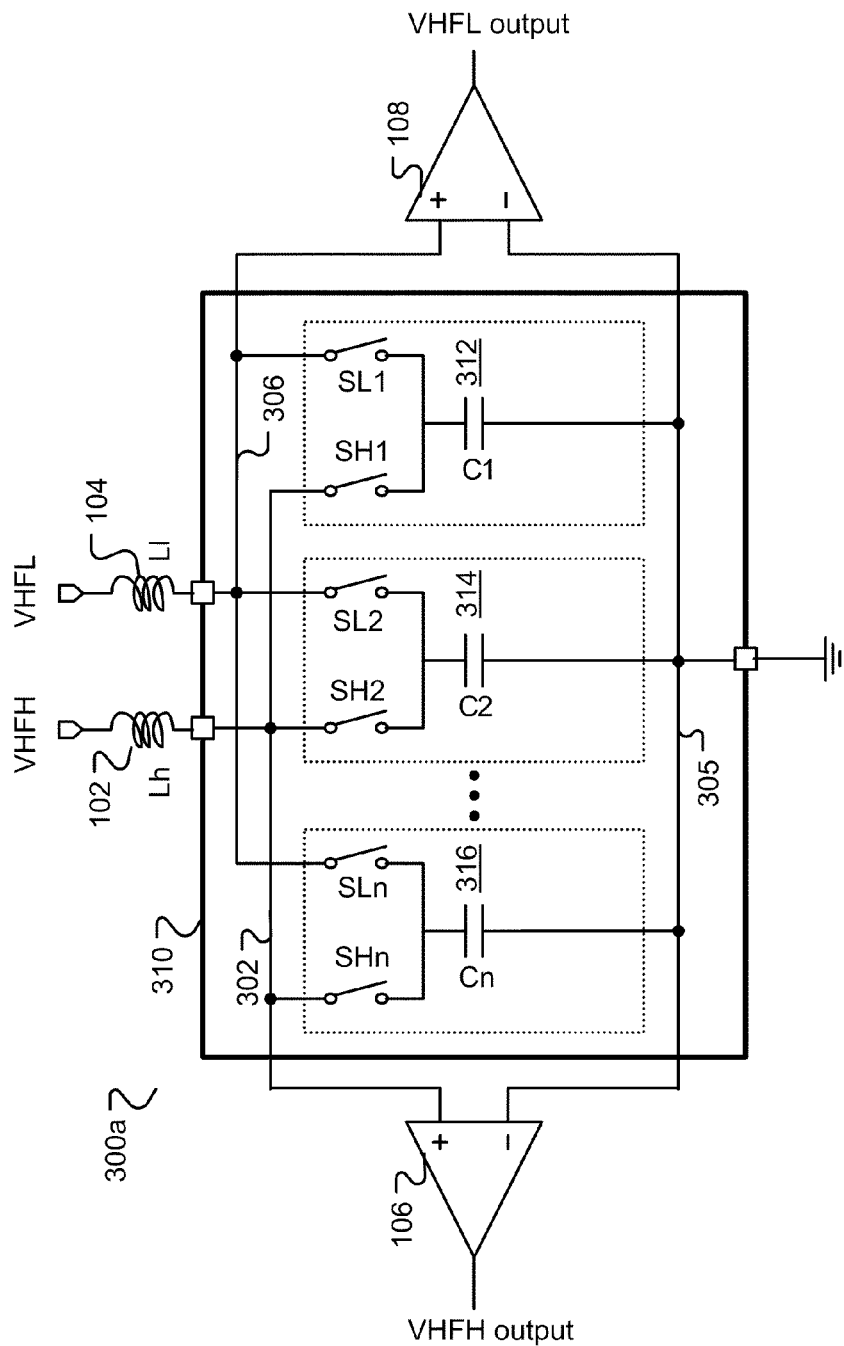
FIG. 3A illustrates an example of shared programmable switched capacitor arrays being used by two single-ended tuning circuits for a multiple-band radio receiver.

FIG. 3A illustrates an exemplary implementation of tuning circuit using a shared capacitance device according to one embodiment of the present invention. The tuning circuit 300a is for single-end signals. The input signals VHFH and VHFL are coupled to the shared adjustable capacitance device 310 through individual inductors 102 and 104. The shared capacitance device 310 comprises n sections 312-316 of capacitor elements where each section comprises a capacitor (C1-Cn), connected in series with a respective switch (SH1-SHn) for the high band and in series with a respective switch (SL1 through SLn) for the low band. The switches SH1 through SHn selectively connect respective capacitors C1 through Cn to the node 302. The inductor 102 and the coupled SCA 310 via the node 302 form the tuning circuit for the high band. Similarly, the switches SL1 through SLn selectively connect respective capacitors C1 through Cn to the node 306. The inductor 104 and the coupled SCA 310 via the node 306 form the tuning circuit for the low band. The node 305 is used as common ground. One of the two sets of switches SH1-SHn and SL1-SLn will be used at one time depending on the mode control. For example, if the mode control selects the high band, the set of switches SH1-SHn will become active and will be used to selectively connect the capacitors C1 through Cn to the node 302 and 304. On the other hands, the inactive set of switches SL1-SLn will be all in the OFF state. If the mode control selects the low band, the set of switches SL1-SLn will become active and the other set SH1-SHn will be inactive. Compared with the implementation of FIG. 2A, the implementation of FIG. 3A demonstrates a distinct advantage by eliminating the need for two sets of SCAs. Consequently, the implementation according to FIG. 3A results in a smaller silicon area and reduces cost.

Figure 3B:
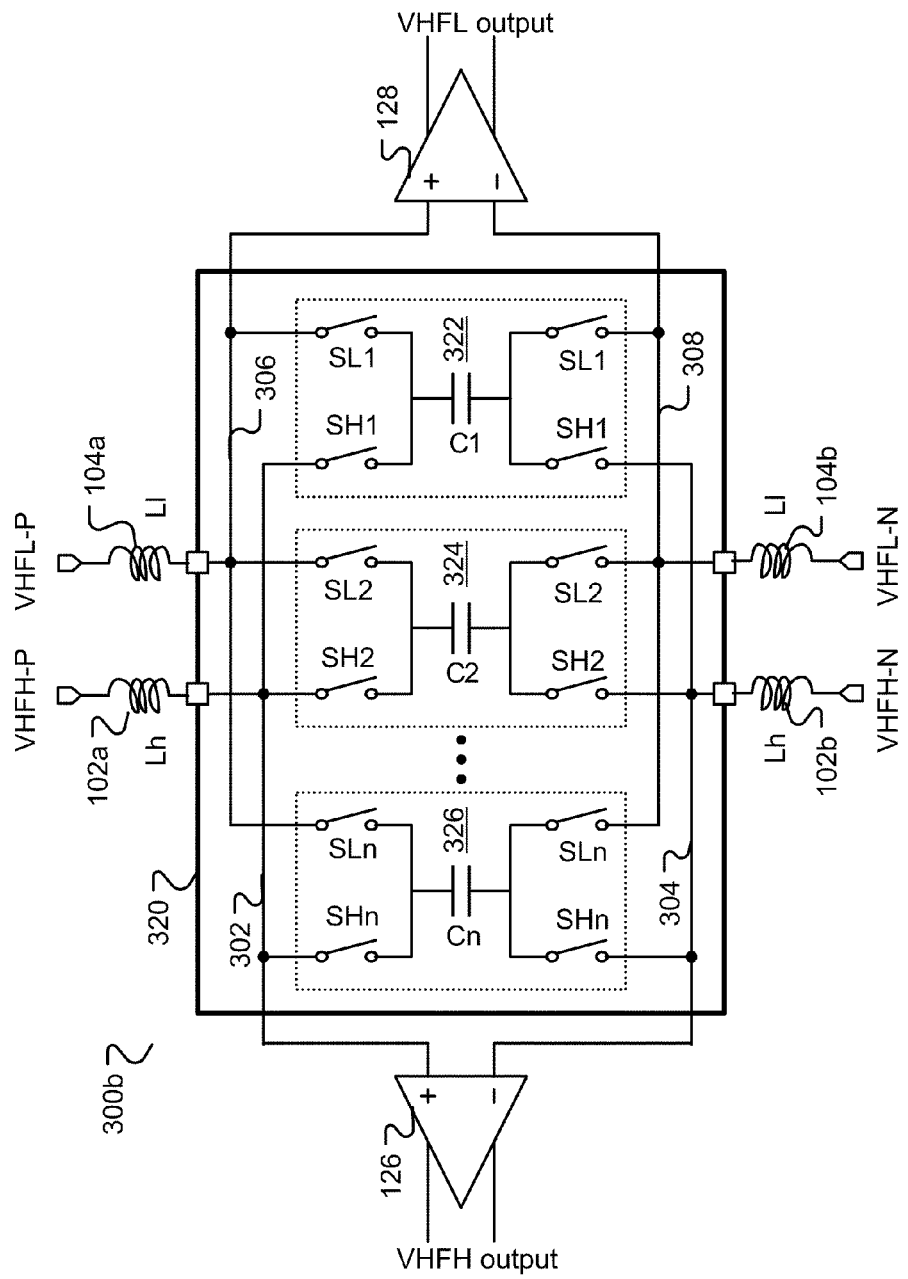
FIG. 3B illustrates an example of shared programmable switched capacitor arrays being used by two differential tuning circuits for a multiple-band radio receiver.

FIG. 3B illustrates an exemplary implementation of tuning circuit using a shared capacitance device according to another embodiment of the present invention. The tuning circuit 300b is for differential signals. The differential input signals for the high band VHFH-P and VHFH-N are coupled to the shared adjustable capacitance device 320 through individual inductors 102a and 102b. The differential input signals for the low band VHFL-P and VHFL-N are coupled to the shared adjustable capacitance device 320 through individual inductors 104a and 104b. The shared capacitance device 320 comprises n sections 322-326 of capacitor elements where each section comprises a capacitor (C1-Cn) connected in series with a pair of respective switches (SH1-SHn) for the high band and in series with a pair of respective switches (SL1-SLn) for the low band. The switch pairs SH1 through SHn selectively connect respective capacitors C1 through Cn to nodes 302 and 304. The inductors 102a and 102b and the coupled SCA 320 via nodes 302 and 304 form the tuning circuit for the high band. Similarly, the switch pairs SL1 through SLn selectively connect respective capacitors C1 through Cn to nodes 306 and 308. The inductor 104a and 104b and the coupled SCA 320 via nodes 306 and 308 form the tuning circuit for the low band. Again, Only one of the two sets of switches SH1-SHn and SL1-SLn will be used at one time depending on the mode control. For example, if the mode control selects the high band, the set of switches SH1-SHn will become active and will be used to selectively connect the capacitors C1 through Cn to the node 302. On the other hands, the inactive set of switches SL1-SLn will be all in the OFF state. If the mode control selects the low band, the set of switches SL1-SLn will become active and the other set SH1-SHn will be inactive. Compared with the implementation of FIG. 2B, the implementation of FIG. 3B demonstrates a distinct advantage by eliminating the need for two sets of SCAs. Consequently, the implementation according to FIG. 3B results in a smaller silicon area and reduces cost.

Figure 3C:
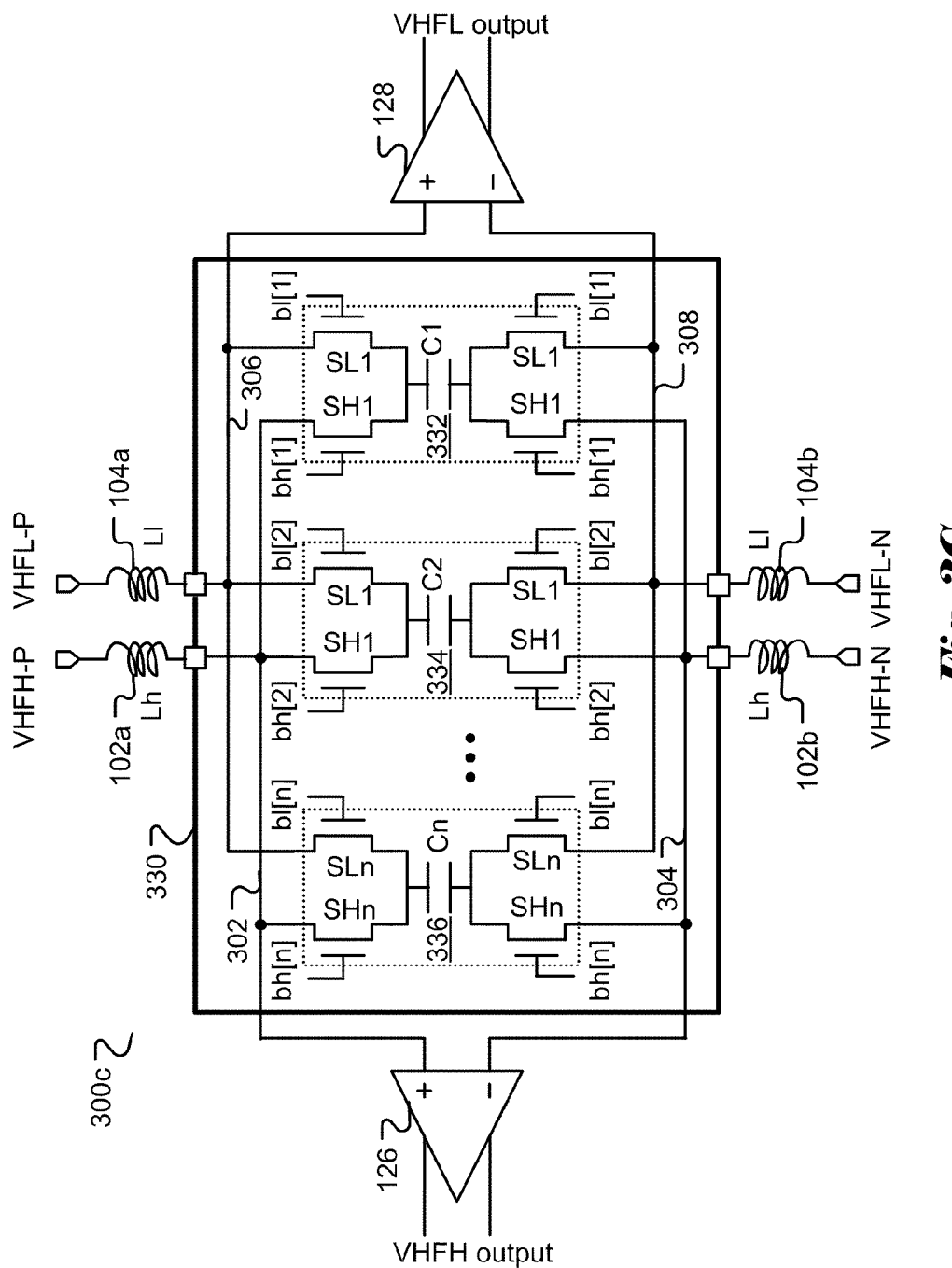
FIG. 3C illustrates an example of shared programmable switched capacitor arrays being used by two differential tuning circuits for a multiple-band radio receiver, where transistors are used as switches the capacitors according to control bits.

FIG. 3C illustrates another exemplary tuning circuit 300c where implementation of the switches of FIG. 3B is based on transistors. The SCA 330 comprises n sections 332-336 of capacitor elements where the switches SH1 through SHn and switches SL1 through SLn are implemented using transistors. Each transistor has a control signal applied to the gate of the transistor to cause the transistor in an ON or OFF state. When the pair of transistor is ON, the respective capacitor is connected to the respective nodes of the SCA. A set of control bits bh[1] though bh[n] is used to adjust the capacitance value for the high band and a set of control bits bl[1] though bl[n] is used to adjust the capacitance value for the low band. When CMOS technology is used to implement the tuning circuit, the transistors may be implemented as a MOSFET transistor. The control bits bh[1] though bh[n] and bl[1] though bl[n] may be generated by a programmable control register in response to desired characteristics of the tuning circuit and the register may be on-chip or off-chip. The desired characteristics of the tuning circuit may include the tuning frequency and the associated control bits may be pre-defined or dynamically determined according to a control method.

Figure 4:
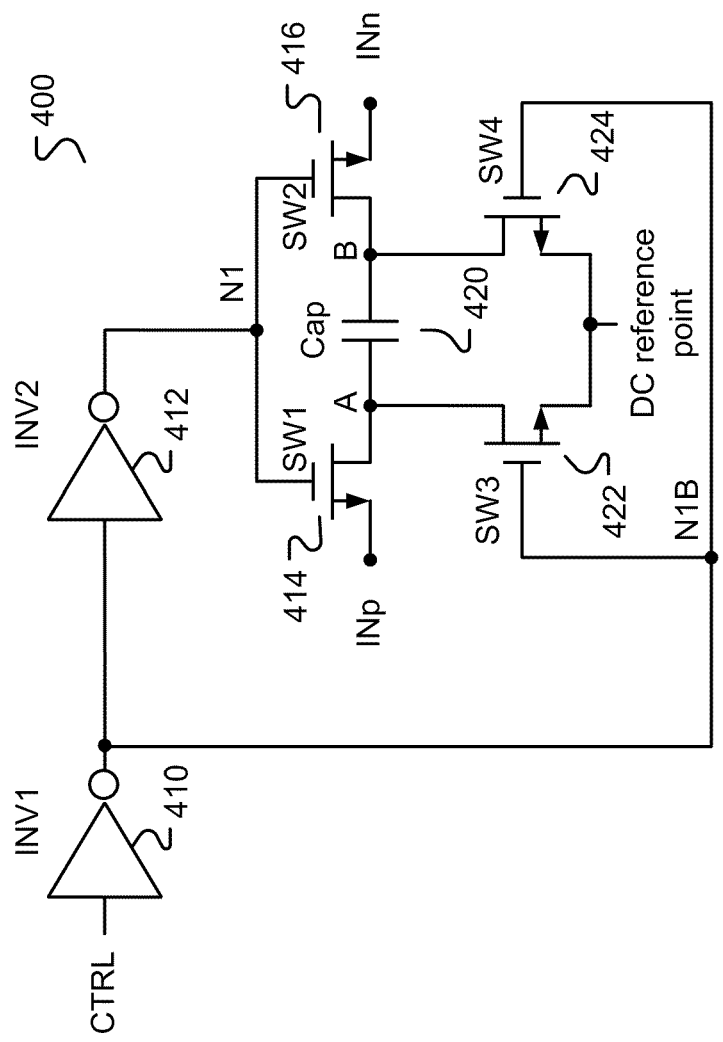
FIG. 4 illustrates an exemplary structure for a section of capacitor device according to a prior art.

When the capacitor is disconnected by the respective switches, i.e., transistors in this above example, the voltage of the two nodes of the capacitor will be left floating, which may cause inadvertent effect on associate circuit. Therefore, the two nodes of the capacitor are connected to a fixed voltage when the capacitor is disconnected by the respective transistors. FIG. 4 illustrates an example of detailed structure of one section of capacitor element 400 according to a prior art. The capacitor 420 is connected between two nodes of a tuning circuit INp and INn through respective switches SW1 and SW2, i.e., transistors 414 and 416. When both transistors 414 and 416 are "off", the two nodes A and B of the capacitor 420 will be left floating. To overcome this floating voltage issue, a pair of transistors 422 and 424 is used to connect nodes A and B to a fixed voltage, i.e. DC reference point in this particular example when the capacitor is disconnected from the INp and INn by the pair of switches SW3 and SW4, i.e., transistors 414 and 416. The switches in the example of FIG. 4 can be realized by NMOS transistors. In order to properly provide the control signals for the switch pair SW1/SW2 and switch pair SW3/SW4, the two control signals have to be complementary. As shown in FIG. 4, a pair of inverters 410 and 412 is used to generate the desired signals from a control input. When CTRL is low, the signal N1 will be low and signal N1b will be high, which will cause switches SW1 and SW2 to be "off" and switches SW3 and SW4 to be "on". Therefore, the capacitor 420 is disconnected from the tuning circuit nodes INp and INn and the nodes A and B are connected to a fixed voltage through switched SW3 and SW4. This voltage is usually chosen to be one that will not cause any inadvertent effect on associated circuit. When CTRL is high, the signal N1 is high and N1b is low, which will cause switches SW1 and SW2 to be "on" and switches SW3 and SW 4 to be "off". The capacitor is connected to the tuning circuit nodes INp and INn. At the same time, the nodes A and B will not be connected to the fixed reference voltage because switches SW3 and SW4 are "off".

Figure 5:
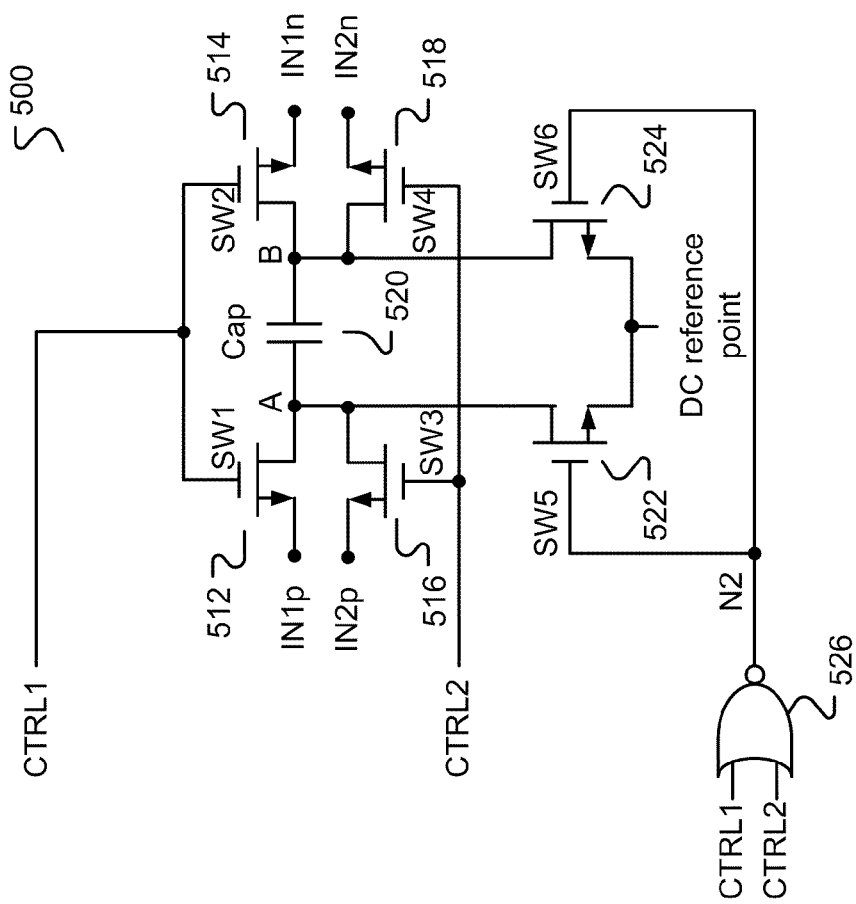
FIG. 5 illustrates an exemplary structure for a section of capacitor device for sharing by two tuning circuits according to the present invention.

FIG. 5 illustrates a structure of one section of capacitor element 500 according to an embodiment of the present invention for tuning cap sharing. Two sets of switches, SW1/SW2 and SW3/SW4 are controlled by two separate control signals CTRL1 and CTRL2 respectively. Switches SW1/SW2 and SW3/SW4 are implemented by NMOS transistors 512/514 and 516/518 respectively. The switches SW5 522 and SW6 524 will connect the two nodes A and B to a DC reference point when the capacitor 520 is disconnected from IN1p/IN1n and IN2p/IN2n. In other words, when any one of CTRL1 and CTRL2 causes the capacitor 520 to be connected to a tuning circuit, the nodes A and B should not be connected to the DC reference point. The logic gate 526 is used to implement the required logic to control switches SW5 522 and SW6 524, where both SW5 522 and SW6 524 will be on when both CTRL1 and CTRL2 are low.

While an example of shared SCA associated with LNA tuning circuit is illustrated herein, the present invention is not limited to the LNA tuning circuit. For example, a frequency synthesizer may have to provide frequency signals in two distinct bands. Two separate tuning circuits may be required where two SCAs may be used. An implementation of the two tuning circuits according to the present invention can reduce the two SCAs to one SCA by sharing. Furthermore, while the examples illustrated herein are for radio receivers, the present invention may also be used for radio transmitter where multiple tuning circuits are used to transmit signals in multiple bands.

The invention may also involve a number of functions to be performed by a computer processor, a digital signal processor, a microprocessor, or field programmable gate array (FPGA). These processors can be configured to perform particular tasks according to the invention, by executing machine-readable software code or firmware code that defines the particular methods embodied by the invention. The software code or firmware codes may be developed in different programming languages and different format or style. The software code may also be compiled for different target platform. However, different code formats, styles and languages of software codes and other means of configuring code to perform the tasks in accordance with the invention will not depart from the spirit and scope of the invention.

The invention may be embodied in other specific forms without departing from its spirit or essential characteristics. The described examples are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A device to provide two tuning circuits, comprising:
   at least one first tuning component coupled to a first node;
   at least one second tuning component coupled to a second node; and
   at least one variable capacitance device configured to selectively couple to one of the first node and the second node according to mode control;
   wherein said at least one first tuning component and said at least one variable capacitance device form a first tuning circuit when the mode control causes said at least one variable capacitance device to couple to the first node;
   wherein said at least one second tuning component and said at least one variable capacitance device form a second tuning circuit when the mode control causes said at least one variable capacitance device to couple to the second node; and
   wherein said at least one variable capacitance device is shared by the first tuning circuit and the second tuning circuit.

2. The device of claim 1, wherein said at least one variable capacitance device comprises a digitally programmable switched capacitor array configured to adjust tuning frequency of one of the first tuning circuit and the second tuning circuit according to the mode control; wherein the tuning frequency is adjusted in response to a plurality of first tuning control signals for the first tuning circuit and in response to a plurality of second tuning control signals for the second tuning circuit; and wherein the plurality of first tuning control signals and the plurality of second tuning control signals are generated by a digitally programmable control register.

3. The device of claim 2, wherein said digitally programmable switched capacitor array comprises a plurality of capacitor sections coupled in parallel.

4. The circuit of claim 3, wherein each of the plurality of capacitor sections comprises a fixed capacitor; wherein said digitally programmable switched capacitor array further comprises a plurality of first transistors and a plurality of second transistors; each of the plurality of first transistors being coupled in series with the first node and the fixed capacitor in a respective one of the plurality of capacitor sections; each of the plurality of second transistors being coupled in series with the second node and the fixed capacitor in a respective one of the plurality of capacitor sections; and wherein each of the plurality of first tuning control signals controls a respective transistor in the plurality of first transistors and each of the plurality of second tuning control signals controls a respective transistor in the plurality of second transistors.

5. The device of claim 4, wherein the plurality of first tuning control signals and the plurality of second tuning control signals comprise multiple bits of a digital signal.

6. The device of claim 1, wherein said at least one first tuning component and said at least one second tuning component comprise an inductor.

7. The device of claim 1, wherein said at least one first tuning component and said at least one second tuning component comprise a resistor.

8. An integrated circuit for a radio frequency receiver, comprising:
   a low-noise amplifier (LNA) coupled to receive a radio frequency signal using two tuning circuits;
   at least one first tuning component coupled to a first node;
   at least one second tuning component coupled to a second node; and
   at least one variable capacitance device configured to selectively couple to one of the first node and the second node according to mode control;
   wherein said at least one first tuning component and said at least one variable capacitance device form a first tuning circuit when the mode control caused said at least one variable capacitance device to couple to the first node;
   wherein said at least one second tuning component and said at least one variable capacitance device form a second tuning circuit when the mode control caused said at least one variable capacitance device to couple to the second node; and
   wherein said at least one variable capacitance device is shared by the first tuning circuit and the second tuning circuit.

9. The integrated circuit of claim 8, wherein said at least one variable capacitance device comprises a digitally programmable switched capacitor array configured to adjust tuning frequency of one of the first tuning circuit and the second tuning circuit according to the mode control; wherein the tuning frequency is adjusted in response to a plurality of first tuning control signals for the first tuning circuit and in response to a plurality of second tuning control signals for the second tuning circuit; and wherein the plurality of first tuning control signals and the plurality of second tuning control signals are generated by a digitally programmable control register.

10. The integrated circuit of claim 9, wherein said digitally programmable switched capacitor array comprises a plurality of capacitor sections coupled in parallel.

11. The integrated circuit of claim 10, wherein each of the plurality of capacitor sections comprises a fixed capacitor; wherein said digitally programmable switched capacitor array further comprises a plurality of first transistors and a plurality of second transistors; each of the plurality of first transistors being coupled in series with the first node and the fixed capacitor in a respective one of the plurality of capacitor sections; each of the plurality of second transistors being coupled in series with the second node and the fixed capacitor in a respective one of the plurality of capacitor sections; and wherein each of the plurality of first tuning control signals controls a respective transistor in the plurality of first transistors and each of the plurality of second tuning control signals controls a respective transistor in the plurality of second transistors.

12. The integrated circuit of claim 11, wherein the plurality of first tuning control signals and the plurality of second tuning control signals comprise multiple bits of a digital signal.

13. The integrated circuit of claim 8, wherein said at least one first tuning component and said at least one second tuning component comprise an inductor.

14. The integrated circuit of claim 8, wherein said at least one first tuning component and said at least one second tuning component comprise a resistor.

15. A method of sharing an adjustable capacitance device by two tuning circuits, the method comprising:
   providing at least one first tuning component coupled to a first node;
   providing at least one second tuning component coupled to a second node;
   providing at least one variable capacitance device; and
   coupling said at least one variable capacitance device selectively to one of the first node and the second node to form respectively one of a first tuning circuit and a second tuning circuit according to mode control;
   wherein said at least one variable capacitance device is shared by the first tuning circuit and the second tuning circuit; and
   wherein said at least one variable capacitance device comprises a digitally programmable switched capacitor array configured to adjust tuning frequency of one of the first tuning circuit and the second tuning circuit according to the mode control.

16. The method of claim 15, further comprising:
   applying a plurality of first tuning control signals to the first tuning circuit to adjust the tuning frequency of the first tuning circuit if said at least one variable capacitance device is coupled to the first node according to the mode control.

17. The method of claim 15, further comprising:
   applying a plurality of second tuning control signals to the second tuning circuit to adjust the tuning frequency of the second tuning circuit if said at least one variable capacitance device is coupled to the second node according to the mode control.

* * * * *